(12) United States Patent
Bae et al.

(10) Patent No.: US 7,907,693 B2
(45) Date of Patent: Mar. 15, 2011

(54) SEMICONDUCTOR DEVICE, A PARALLEL INTERFACE SYSTEM AND METHODS THEREOF

(75) Inventors: Seung-Jun Bae, Daejeon (KR);
Seong-Jin Jang, Seongnam-si (KR);
Beom-Sig Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 930 days.

(21) Appl. No.: 11/812,438

(22) Filed: Jun. 19, 2007

(65) Prior Publication Data
US 2007/0297552 A1 Dec. 27, 2007

(30) Foreign Application Priority Data
Jun. 22, 2006 (KR) .................. 10-2006-0056563

(51) Int. Cl.
*H04L 7/00* (2006.01)
(52) U.S. Cl. .......... 375/371; 375/373; 375/376; 375/355
(58) Field of Classification Search .................. 375/371, 375/373, 376
See application file for complete search history.

(56) References Cited

U.S. PATENT DOCUMENTS 6,719,366 B2 * 4/2004 Lane ................................ 297/95
6,874,097 B1 * 3/2005 Aliahmad et al. ............. 713/401
(Continued)

FOREIGN PATENT DOCUMENTS
JP 2002-044061 2/2002
(Continued)

OTHER PUBLICATIONS
Korean Patent Office Action dated Aug. 22, 2008 for Korean Patent Application No. 10-2006-0056563.

*Primary Examiner* — Shuwang Liu
*Assistant Examiner* — Kenneth Lam
(74) *Attorney, Agent, or Firm* — Harness, Dickey & Pierce, P.L.C.

(57) ABSTRACT

A semiconductor device, a parallel interface system and methods thereof are provided. The example semiconductor device may include a reference clock transmitting block generating a reference clock signal, a plurality of first transceiver blocks, each of the plurality of first transceiver blocks transmitting at least one parallel data bit signal based on one of a plurality of phase-controlled transmitting sampling clock signals and a per-pin deskew block controlling a phase of a transmitting sampling clock signal to generate the phase-controlled sampling clock signals for the respective plurality of transceiver blocks, the per-pin deskew block controlling the phase of each phase-controlled transmitting sampling clock signal based on a phase skew between a given training data bit signal, among a plurality of training data bit signals, corresponding to a given first transceiver block and the reference clock signal in a first operation mode, and based on phase skew information relating to a phase skew between a given parallel data bit signal of the at least one parallel data bit signal and the reference clock signal in a second operation mode. An example method may include reducing skew based on a comparison between a plurality of transmitted training data bit signals and a corresponding plurality of received training data bit signals in a first mode of operation and reducing skew based on received phase skew information relating to a phase skew difference between a reference signal and a parallel data bit signal in a second mode of operation.

21 Claims, 10 Drawing Sheets

U.S. PATENT DOCUMENTS

| | | | |
|---|---|---|---|
| 6,937,681 B2* | 8/2005 | Watanabe | 375/371 |
| 6,978,403 B2* | 12/2005 | Takei et al. | 714/700 |
| 7,043,657 B1* | 5/2006 | Yang et al. | 713/503 |
| 7,209,531 B1* | 4/2007 | Katz et al. | 375/371 |
| 2002/0091885 A1* | 7/2002 | Hendrickson et al. | 710/100 |
| 2004/0264613 A1* | 12/2004 | Buchmann et al. | 375/354 |
| 2005/0066142 A1* | 3/2005 | Bhattacharya et al. | 711/169 |
| 2006/0023825 A1* | 2/2006 | Kato et al. | 375/372 |
| 2007/0050658 A1* | 3/2007 | Kuwata | 713/503 |

FOREIGN PATENT DOCUMENTS

| | | |
|---|---|---|
| JP | 2004-127147 | 4/2004 |
| JP | 2004-328063 | 11/2004 |
| JP | 2006-050102 | 2/2006 |

* cited by examiner (a)

(b)

SEMICONDUCTOR DEVICE, A PARALLEL INTERFACE SYSTEM AND METHODS THEREOF

PRIORITY STATEMENT

This application claims the priority of Korean Patent Application No. 10-2006-0056563, filed on Jun. 22, 2006, in the Korean Intellectual Property Office, the disclosure of which is incorporated herein in its entirety by reference.

BACKGROUND OF THE INVENTION

1. Field of the Invention

Example embodiments of the present invention relate generally to a semiconductor device, a parallel interface system and methods thereof, and more particularly to a semiconductor device, a parallel interface system and methods of reducing skew.

2. Description of the Related Art

Data transmission rates between semiconductor devices (e.g., between a dynamic random access memory (DRAM) device and a central processing unit (CPU) or a controller) may be limited by a time jitter of a phase locked loop (PLL)/delayed locked loop (DLL), an offset caused by a fabrication error in a transmitter and/or a receiver, interference between transmission signals in a transmission channel, etc.

In parallel interface systems, a parallel data signal and a reference clock signal may be transmitted to a receiver in synchronization with a sampling clock signal of a transmitter. However, due to factors limiting the data transmission rate, a difference in channel time between the reference clock signal and the data signal and/or between data signals may occur if a skew occurs (e.g., because the data transmission rate increases between semiconductor devices). The skew may indicate a phase difference between the reference clock signal and the parallel data signal.

As the skew increases, a voltage margin and a time margin of a transmission data signal may be reduced. If the time margin is reduced, an "indefinite" portion of data may increase (e.g., a metastable data state of the transmission data signal), and it may be more difficult to secure a sufficient setup/hold time. In order to enable a semiconductor device receiving a parallel data signal to correctly identify the data signal, a sampling clock of the receiving semiconductor device may be set to increase the voltage margin and the time margin.

In an example, a synchronous process may be used to set the sampling clock in a parallel interface system. In the conventional synchronizing process, a data signal and a reference clock signal may be separately transmitted to a semiconductor device and the semiconductor device may identify the data signal. However, if a data transmission line is not matched with a reference clock transmission line in the conventional synchronizing process, skew may occur between the data signal and the reference clock signal. Accordingly, it may be difficult to accomplish higher-rate data signal transmission.

FIG. 1A is a timing chart of a reference clock signal CLKref and N parallel data bit signals DQ1 through DQN output from a transmitter within a conventional parallel interface system. FIG. 1B is a timing chart of a reference clock signal CLKref and N parallel data bit signals DQ1' through DQN' input to a receiver within a conventional parallel interface system.

Referring to FIGS. 1A and 1B, the transmitter may transmit the reference clock signal TXCLKref and the N parallel data bit signals DQ1 through DQN to the receiver in response to a transmitting sampling clock signal TXCLK. The receiver may generate a receiving data sampling clock signal CLKda whose phase may be different from that of the received reference clock signal CLKref by a half period. The receiver may sample the received N parallel data bit signals DQ1' through DQN' in response to the receiving data sampling clock signal CLKda. If data transmission lines are not matched with a reference clock transmission line, a timing error (e.g., a phase skew) may occur between the receiving reference clock signal RXCLKref and each signal (e.g., DQ1') of the N parallel data bit signals DQ1' through DQN', as illustrated in FIG. 1B. Accordingly, the receiving data sampling clock signal CLKda may be displaced from a position associated with a theoretical "maximum" time margin. As a result, the time margin and the voltage margin of the N parallel data bit signals DQ1' through DQN' may be reduced.

Referring to FIGS. 1A and 1B, the receiving data sampling clock signal CLKda may be set to provide a higher (e.g., maximum) time margin by performing per-pin deskew process using clock and data recovery (CDR). In the per-pin deskew process CDR, a data signal transmitted per data pin may be oversampled (e.g., two or more times) during a single signal period and a position or phase of the receiving data sampling clock signal CLKda may be extracted based on the values of sampled data signals.

FIGS. 2A through 2C are conceptual diagrams illustrating the conventional per-pin deskew process using CDR. Referring to FIGS. 2A through 2C, the phase of an edge sampling clock CLKed may be different from the phase of a data sampling clock signal CLKda by a half period of the phase of a data signal. The edge sampling clock CLKed may be used to detect edge information in the data signal and the data sampling clock signal CLKda may be used to identify the data signal (e.g., as one of a first logic level, such as a higher logic level or logic "1", and a second logic level, such as a lower logic level or logic "0").

In particular, FIG. 2A illustrates the data sampling clock signal CLKda positioned so as to provide a theoretical maximum time margin, while FIGS. 2B and 2C illustrate conditions where the position of the data sampling clock signal CLKda introduces skew.

Referring to FIGS. 2B and 2C, in order to adjust the position of the data sampling clock signal CLKda so as to match the time margin of FIG. 2A, the data sampling clock signal CLKda may be shifted to the "left" in FIG. 2B and to the "right" in FIG. 2C. The per-pin deskew process using CDR may allow a sampling clock signal to track the changes of a data signal so as to maintain a sampling position approximately at the maximum time margin (e.g., see FIG. 2A) even while data is being transmitted. Accordingly, even if a skew occurs between a data signal and a sampling clock signal (e.g., due to the change of temperature or voltage) while data is being transmitted, the per-pin deskew process using CDR may reduce the skew.

However, the per-pin deskew process using CDR may require an additional sampling clock signal (e.g., the edge sampling clock CLKed) for detecting edge information in the data signal, a receiving circuit for receiving information relating to a phase skew between the data signal and the data sampling clock signal CLKda, and a phase control circuit for changing the position of the data sampling clock signal CLKda (e.g., so as to maintain the maximum time margin). Thus, an area occupied by a circuit for reducing skew may be increased, as well as manufacturing costs. Accordingly, it may be difficult to employ the per-pin deskew process using CDR in parallel data transmission of conventional semiconductor (e.g., dynamic random access memory (DRAM)) devices.

Another conventional process for reducing skew between a data signal and a data sampling clock signal may be a per-pin deskew process using training data. Unlike the conventional per-pin deskew process using CDR, the per-pin deskew process using training data need not include an additional circuit for edge detection in a semiconductor device (e.g., a DRAM device) receiving the data signal.

FIG. 3 is a conceptual diagram illustrating the conventional per-pin deskew process using training data. Referring to FIG. 3, in a conventional parallel interface system, a transmitting semiconductor device (e.g., a controller) may transmit given pattern data referred to as "training data". The transmitting semiconductor device may receive the training data back from the receiving semiconductor device in synchronization with receiving sampling clock signals S1 through S13 having different phases. The transmitting semiconductor device may compare the transmitted training data with the received training data and may determine whether a reception error has occurred based on a result of the comparison.

Referring to FIG. 3, a reception error may occur if the training data is received in synchronization with the receiving sampling clock signals S1 through S3 and S11 through S13. An optimum phase (e.g., a phase having a least probability of error) of a receiving sampling clock signal for the transmitting semiconductor device may be determined based on the determination on the reception error. In other words, the phase of the receiving sampling clock signal S7 having a least probability of error occurrence may be obtained with phase information of the receiving sampling clock signals S4 through S10 in which an error does not occur.

Referring to FIG. 3, phase information may be obtained per data pin in parallel data transmitted by the transmitting semiconductor device using the above-described process. The phase of a receiving sampling clock signal corresponding to each data pin may be controlled based on the phase information. The phase of a transmitting sampling clock signal of the transmitting semiconductor device may be controlled in the same manner.

However, the per-pin deskew process using training data may take a longer period of time to perform as compared to the per-pin deskew process using CDR. Thus, if the per-pin deskew process using training data is performed frequently, system performance may be reduced. Accordingly, in determining whether to use the per-pin deskew process using either training data or CDR data, a system designer may be required to make a trade-off by choosing between the increased occupied chip area allocated to circuitry associated with the per-pin deskew process using CDR data and the decreased performance levels of the per-pin deskew process using training data.

SUMMARY OF THE INVENTION

An example embodiment of the present invention is directed to a semiconductor device included within a parallel interface system, including a reference clock transmitting block generating a reference clock signal, a plurality of first transceiver blocks, each of the plurality of first transceiver blocks transmitting at least one parallel data bit signal based on one of a plurality of phase-controlled transmitting sampling clock signals and a per-pin deskew block controlling a phase of a transmitting sampling clock signal to generate the phase-controlled sampling clock signals for the respective plurality of first transceiver blocks, the per-pin deskew block controlling the phase of each phase-controlled transmitting sampling clock signal based on a phase skew between a given training data bit signal, among a plurality of training data bit signals, corresponding to a given first transceiver block and the reference clock signal in a first operation mode, and based on phase skew information relating to a phase skew between a given parallel data bit signal of the at least one parallel data bit signal and the reference clock signal in a second operation mode.

Another example embodiment of the present invention is directed to a method of for reducing skew between a reference clock signal and each of a plurality of parallel data bit signals in a parallel interface system including a plurality of transceiver blocks, including first mode adjusting a phase of a transmitting sampling clock signal to generate a phase-controlled transmitting sampling clock signal based on a phase skew between a training data bit signal, among a plurality of training data bit signals, corresponding to a given transceiver block and a reference clock signal in a first operation mode and second mode adjusting the phase of the transmitting sampling clock signal to generate the phase-controlled transmitting sampling clock signal based on phase skew information relating to a phase skew between a given parallel data bit signal, among the plurality of parallel data bit signals, and the reference clock signal in a second operation mode.

Another example embodiment of the present invention is directed to a method of reducing skew in a parallel interface system, including reducing skew based on a comparison between a plurality of transmitted training data bit signals and a corresponding plurality of received training data bit signals in a first mode of operation and reducing skew based on received phase skew information relating to a phase skew difference between a reference signal and a parallel data bit signal in a second mode of operation.

Another example embodiment of the present invention is directed to a method and semiconductor device for compensating for a skew between a data signal and a clock signal in a parallel interface system by combining per-pin deskew using clock and data recovery (CDR) and per-pin deskew using training data and for decreasing a required circuit area, and a recording medium for recording the method.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
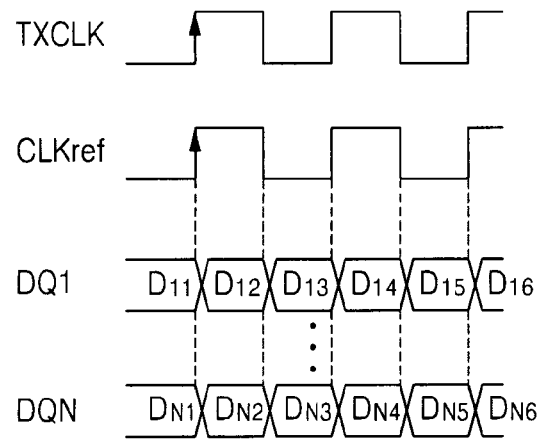
FIG. 1A is a timing chart of a reference clock signal CLKref and N parallel data bit signals DQ1 through DQN output from a transmitter within a conventional parallel interface system.
FIG. 1B is a timing chart of a reference clock signal CLKref and N parallel data bit signals DQ1' through DQN' input to a receiver within a conventional parallel interface system.
Figure 1:
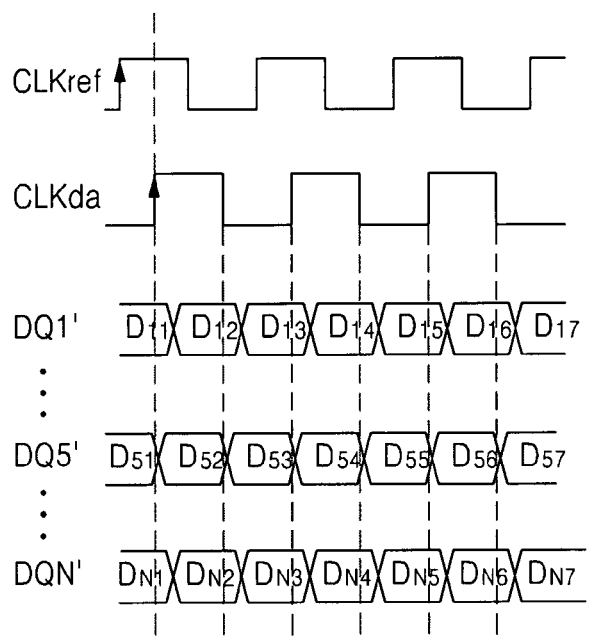

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
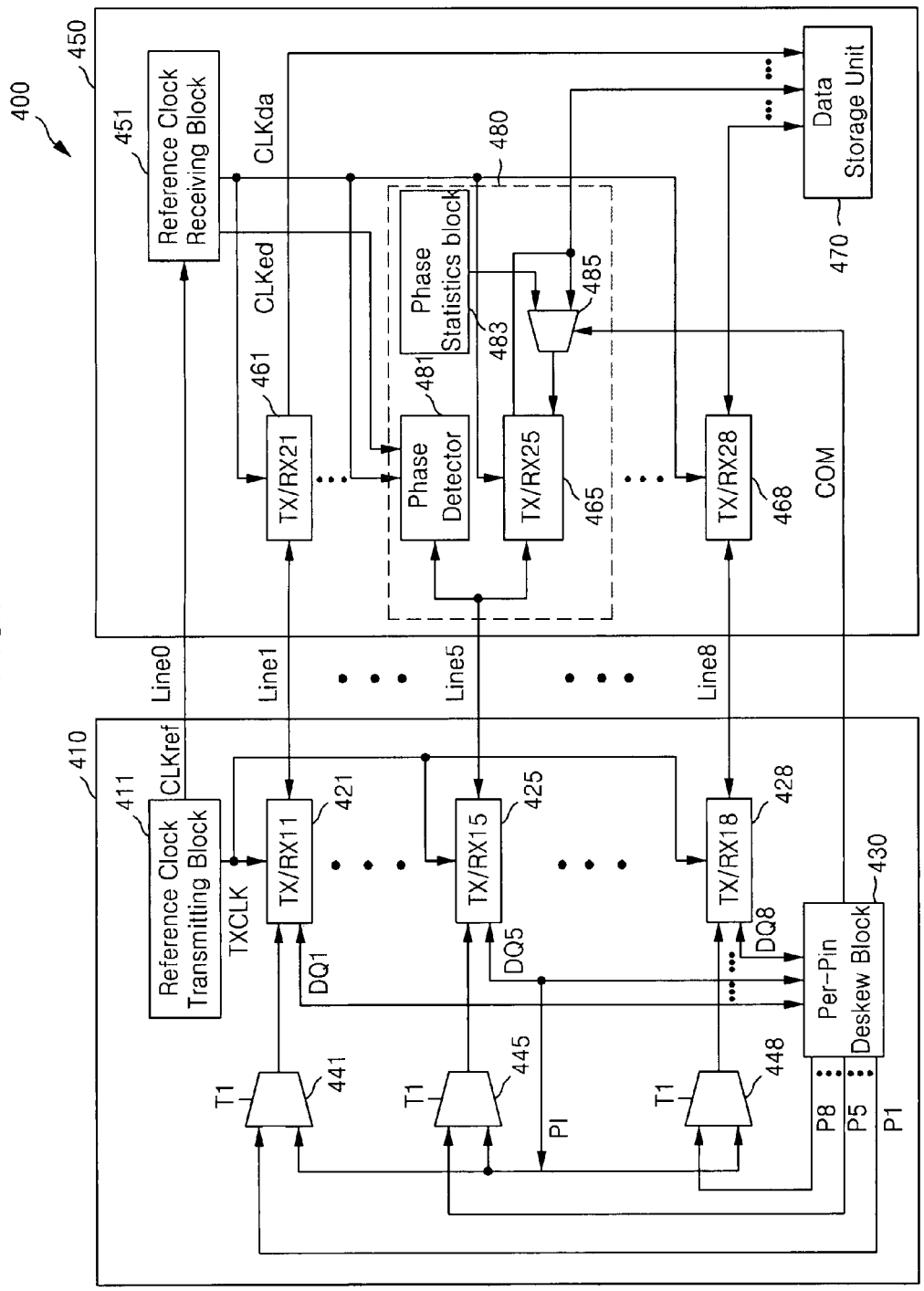
FIG. 4 illustrates a parallel interface system according to an example embodiment of the present invention.

FIG. 4 illustrates a parallel interface system 400 according to an example embodiment of the present invention. In the example embodiment of FIG. 4, the parallel interface system 400 may include a first semiconductor device 410, a second semiconductor device 450 and a plurality of transmission lines Line0 through Line8. In an example, the first semiconductor device 410 may be a memory controller and the second semiconductor device 450 may be a dynamic random access memory (DRAM) device.

In the example embodiment of FIG. 4, the first semiconductor device 410 may include a reference clock signal transmitting block 411, a plurality of first transceiver blocks 421 through 428, a per-pin deskew block 430, and a plurality of first selectors (e.g., multiplexers) 441 through 448.

In the example embodiment of FIG. 4, the reference clock signal transmitting block 411 may transmit a reference clock signal CLKref to the second semiconductor device 450 through the transmission line Line0. In an example, the reference clock signal transmitting block 411 may be implemented by a phase locked loop (PLL) or a delay locked loop (DLL). In addition, the reference clock signal transmitting block 411 may generate a transmitting sampling clock signal TXCLK. The reference clock signal CLKref may be transmitted to the second semiconductor device 450 in synchronization with the transmitting sampling clock signal TXCLK.

In the example embodiment of FIG. 4, the first transceiver blocks 421 through 428 may transmit data bits DQ1 through DQ8, respectively, to the second semiconductor device 450 in synchronization with the transmitting sampling clock signal TXCLK.

Figure 5:
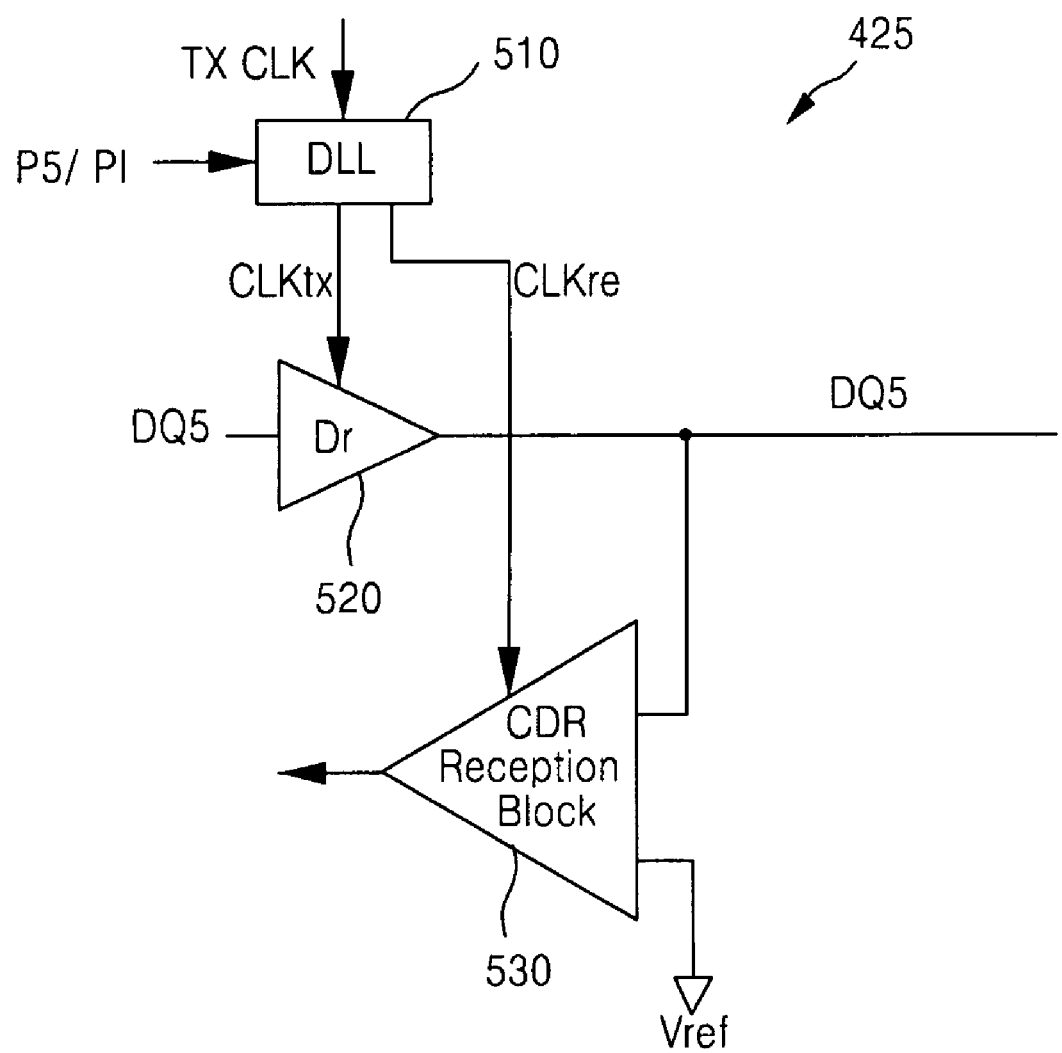
FIG. 5 illustrates a first transceiver block included in a first semiconductor device of FIG. 4 according to another example embodiment of the present invention.

FIG. 5 illustrates the first transceiver block 425 included in the first semiconductor device 410 of FIG. 4 according to another example embodiment of the present invention. In the example embodiment of FIGS. 4 and 5, the first transceiver block 425 may include a DLL block 510, a first transmission driver 520, and a clock and data recovery (CDR) reception block 530. In an example, each of the first transceiver blocks 421 through 428 may include the same structure as the first transceiver block 425, with the exception only the first transceiver block 425 may be configured to receive phase skew information PI.

In the example embodiment of FIG. 5, the DLL block 510 may control the phase of the transmitting sampling clock signal TXCLK based on either a corresponding phase control signal P5 among a plurality of phase control signals P1 through P8 or based on the phase skew information PI, so as to output a phase-controlled transmitting sampling clock signal CLKtx. In addition, the DLL block 510 may control the phase of the transmitting sampling clock signal TXCLK based on phase information extracted by the CDR reception block 530 so as to output a phase-controlled receiving sampling clock signal CLKre.

In the example embodiment of FIG. 5, the first transmission driver 520 may transmit a data bit DQ5 in synchronization with the phase-controlled transmitting sampling clock signal CLKtx. The CDR reception block 530 may receive one of the data bit DQ5 and the phase skew information PI from a second transceiver block 465 included in the second semiconductor device 450. In an example, the CDR reception block 530 may receive the data bit DQ5 in a normal data transmission/reception mode and may alternatively receive the phase skew information PI in a phase skew information reception mode through the data line Line5. In addition, the CDR reception block 530 may extract the phase information (e.g., which may be used to control the phase of the transmitting sampling clock signal TXCLK to generate the phase-controlled receiving sampling clock signal CLKre) based on the data bit DQ5 received from the second transceiver block 465.

Returning to the example embodiment of FIG. 4, the per-pin deskew block 430 may control (e.g., individually control) the phase of the transmitting sampling clock signal TXCLK corresponding to each of the first transceiver blocks 421 through 428 based on a phase skew between the reference clock signal CLKref and each of a plurality of bits (e.g., 8 bits) of training data in a first mode. In the first mode, the per-pin deskew block 430 may output the phase control signals P1 through P8 for controlling (e.g., individually controlling) the phases of the transmitting sampling clock signal TXCLK for the first transceiver blocks 421 through 428, respectively.

In the example embodiment of FIG. 4, the first mode may be a power-up mode (e.g., an initial mode) of the parallel interface system 400. The per-pin deskew block 430 may reduce skew (e.g., "static skew") between each data bit (e.g., DQ5) and the reference clock signal CLKref (e.g., which may occur due to physical or structural dismatching in the parallel interface system 400) in the initial mode.

In the example embodiment of FIG. 4, the per-pin deskew block 430 may enable the 8-bit training data to be transmitted to the second semiconductor device 450 in synchronization with the transmitting sampling clock signal TXCLK, which may be controlled so as to have different phase values in the first semiconductor device 410, and may receive 8-bit training data fed back from the second semiconductor device 450. The per-pin deskew block 430 may determine whether one or more bits in the received 8-bit training data includes an error and may obtain phase values of the transmitting sampling clock signal TXCLK, at which an error is determined not to occur, with respect to the respective bits of the training data. The per-pin deskew block 430 may obtain an average of the phase values corresponding to the respective data bits and may output the phase control signals P1 through P8. The phase of the transmitting sampling clock signal TXCLK for each data bit may be controlled to have the average phase value by a corresponding phase control signal (e.g., P1).

In the example embodiment of FIG. 4, the first selectors 441 through 448 may receive the corresponding phase control signals P1 through P8, respectively, and the phase skew information PI. In addition, each of the first selectors 441 through 448 may output either a corresponding phase control signal (e.g., P5) or the phase skew information PI to a corresponding first transceiver block (e.g., first transceiver block 425) among the plurality of the first transceiver blocks 421 through 428 in response to a mode control signal T1.

In the example embodiment of FIG. 4, the phases of the phase-controlled transmitting sampling clock signal CLKtx, which may respectively correspond to the first transceiver blocks 421 through 428, may be collectively controlled based on the phase skew information PI received from the second semiconductor device 450 in a second mode. In an example, the second mode may be an operating mode of the parallel interface system 400. In another example, even if the static skew is reduced using the training data, a skew between a data signal and a clock signal may occur due to the change of temperature or voltage during an operation of the parallel interface system 400. Skew occurring during an operation of the parallel interface system 400 may be referred to as "dynamic skew". Accordingly, dynamic skew may be reduced in the second mode.

In the example embodiment of FIG. 4, the phase skew information PI may include information relating to a position of the transmitting sampling clock signal TXCLK, which may be extracted from a bit (e.g., DQ5) among the 8 bits DQ1 through DQ8 transmitted from the first semiconductor device 410 to the second semiconductor device 450.

In the example embodiment of FIG. 4, the phases of the transmitting sampling clock signal TXCLK may be collectively controlled based on the phase skew information PI extracted from the bit DQ5. However, it is understood that other example embodiments of the present invention need not be limited thereto. For example, the phases of the transmitting sampling clock signal TXCLK may be controlled based on phase skew information extracted from at least two bits (e.g., DQ3 and DQ7), among the 8 bits DQ1 through DQ8, and/or any other combination of bits. The phases of the transmitting sampling clock signal TXCLK may be controlled for the bits DQ1 through DQ5, respectively, based on the phase skew information extracted from the bit DQ3 while the phases of the transmitting sampling clock signal TXCLK may be controlled for the bits DQ6 through DQ8, respectively, based on the phase skew information extracted from the bit DQ7. The phase skew information extracted from the bit DQ3 may be transmitted through the transmission line Line3 and the phase skew information extracted from the bit DQ7 may be transmitted through the transmission line Line7.

In the example embodiment of FIG. 4, the second semiconductor device 450 may include a reference clock signal receiving block 451, a plurality of second transceiver blocks 461 through 468, a data storage unit 470, a phase detector 481, a phase statistics block 483 and a second selector 485. The second transceiver block 465, the phase detector 481, the phase statistics block 483 and the second selector 485 may form a phase detection block 480 for detecting a phase skew between the data bit DQ5 and the reference clock signal CLKref.

In the example embodiment of FIG. 4, the reference clock signal receiving block 451 may receive the reference clock signal CLKref from the reference clock signal transmitting block 411 and may generate a data sampling clock signal CLKda and an edge sampling clock signal CLKed based on the reference clock signal CLKref. The edge sampling clock signal CLKed may be used to detect edge information in a transmitted data signal (e.g., DQ5) and the data sampling clock signal CLKda may be used to identify the transmitted data signal (e.g., DQ5). In an example, the edge sampling clock signal CLKed may have a half-period phase difference with the data sampling clock signal CLKda.

In the example embodiment of FIG. 4, the second transceiver blocks 461 through 468 may transmit and receive the 8 bits DQ1 through DQ8 of parallel data to and from the first transceiver blocks 421 through 428, respectively. Each of the second transceiver blocks 461 through 468 may receive a corresponding bit among the 8 bits DQ1 through DQ8 of parallel data in synchronization with the data sampling clock signal CLKda. The data storage unit 471 may store the received bits DQ1 through DQ8 of parallel data.

In the example embodiment of FIG. 4, the phase detection block 480 may include the second transceiver block 465, the phase detector 481, the phase statistics block 483 and the second selector 485.

Figure 6:
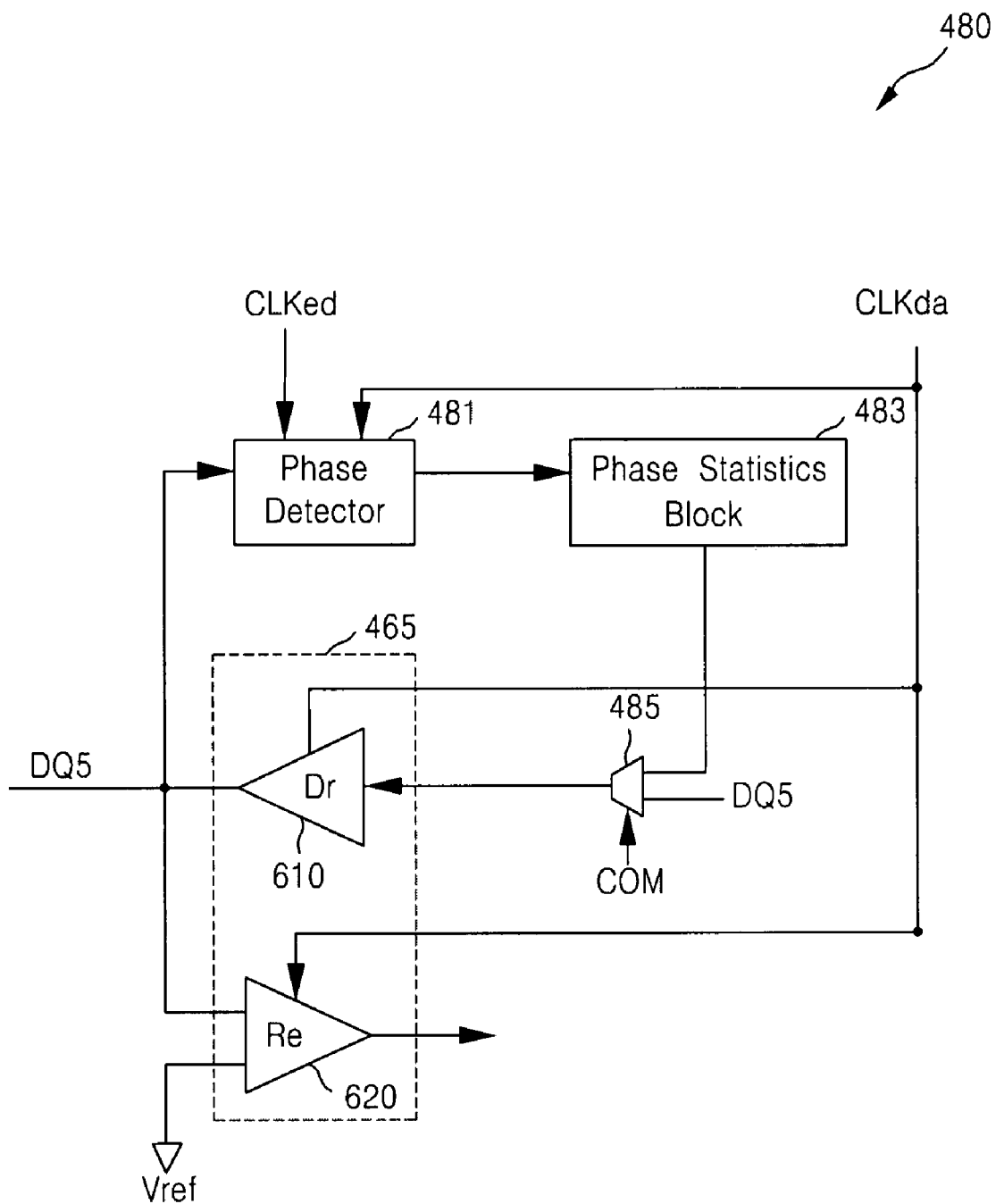
FIG. 6 illustrates a phase detection block included in the parallel interface system of FIG. 4 according to another example embodiment of the present invention.

FIG. 6 illustrates the phase detection block 480 included in the parallel interface system 400 of FIG. 4 according to another example embodiment of the present invention. In the example embodiment of FIG. 6, the second transceiver block 465 may include a second transmission driver 610 and a receiver 620. In an example, the other second transceiver blocks 461 through 464 and 466 through 468 may include the same structure and arrangement as the second transceiver block 465.

In the example embodiment of FIG. 6, the phase detector 481 may extract phase skew information for controlling the phase of the transmitting sampling clock signal TXCLK in the first transceiver block 425 from the data bit DQ5 received from the first transceiver block 425. The phase statistics block 483 may calculate a statistical value with respect to the phase skew information detected by the phase detector 481 during a given data period. For example, the phase statistics block 483 may calculate an average of the phase skew information detected during the given data period and may output the calculated average.

In the example embodiment of FIG. 6, the second selector 485 may select one of an output of the phase statistics block 483 and an output of the data storage unit 470 based on a control command COM received from the first semiconductor device 410. The second selector 485 may output the selected output to the second transceiver block 465. In an example, the time at which the second selector 485 selects the output of the phase statistics block 483 may be adjusted by the first semiconductor device 410 to conform to an environment of the parallel interface system 400.

Accordingly, in the example embodiment of FIG. 6, the second transceiver block 465 may transmit the data bit DQ5 to the first semiconductor device 410 through the data line Line5 during a normal data transmitting/receiving operation and may alternatively transmit the phase skew information output from the phase statistics block 483 to the first semiconductor device 410 through the data line Line5 during a phase skew information transmitting operation.

Figure 7:
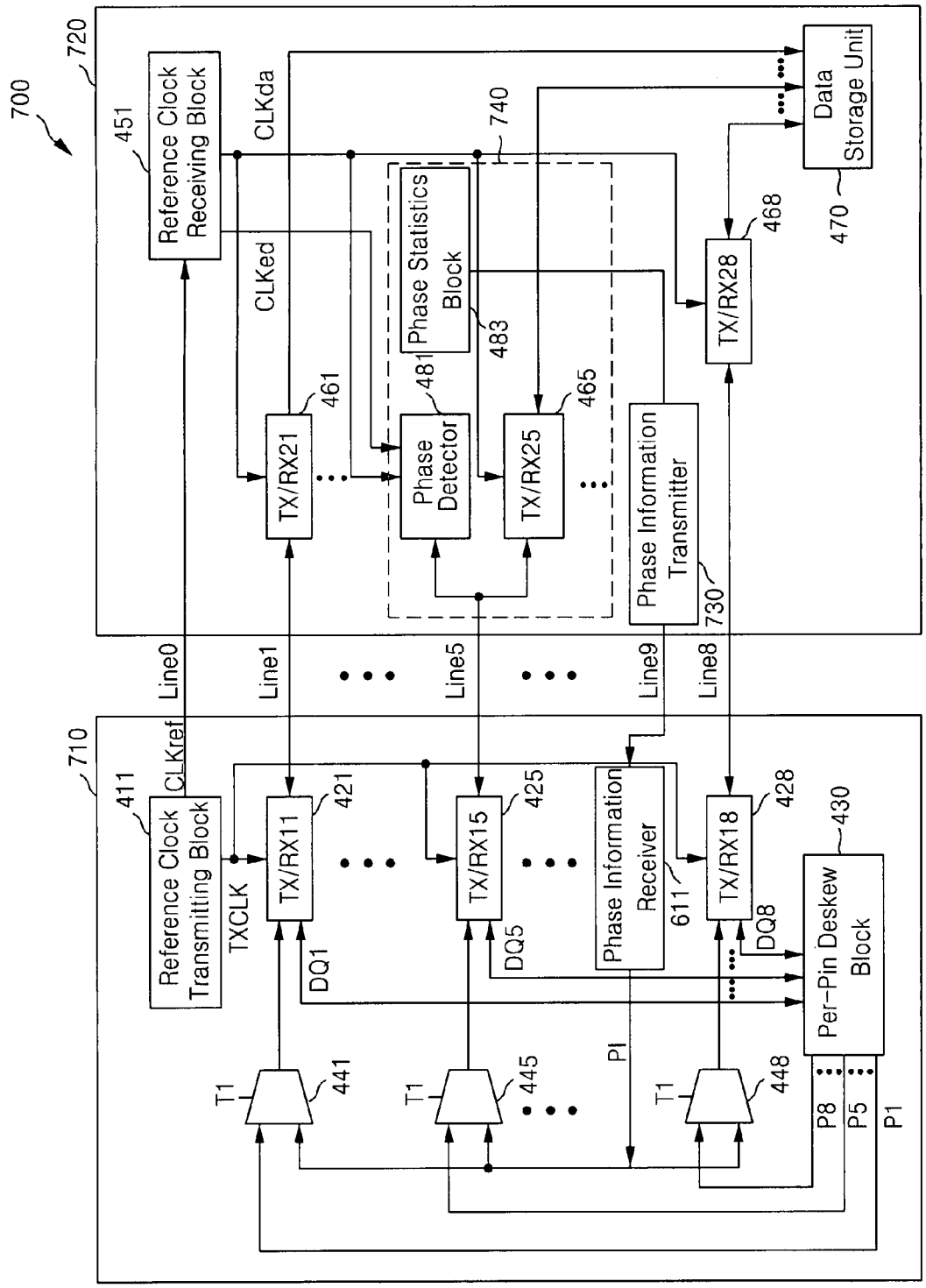
FIG. 7 illustrates a parallel interface system according to another example embodiment of the present invention.

FIG. 7 illustrates a parallel interface system 700 according to another example embodiment of the present invention. In the example embodiment of FIG. 7, the parallel interface system 700 may include a first semiconductor device 710 and a second semiconductor device 720. The first semiconductor device 710 may include the reference clock signal transmitting block 411, the first transceiver blocks 421 through 428, the per-pin deskew block 430, the first selectors 441 through 448 and a phase information receiver 611. In an example, the elements 411, 421 through 428, 430, and 441 through 448 may be configured in the same manner as above-described with respect to FIG. 4. Accordingly, a further description thereof has been omitted for the sake of brevity.

In the example embodiment of FIG. 7, the phase information receiver 611 may receive the phase skew information PI from the second semiconductor device 720 and may outputs the received phase skew information PI to the first selectors 441 through 448. The second semiconductor device 720 may include the reference clock signal receiving block 451, the second transceiver blocks 461 through 468, the data storage unit 470, the phase detector 481, the phase statistics block 483 and a phase information transmitter 730. In an example, the reference clock signal receiving block 451, the second transceiver blocks 461 through 468, the data storage unit 470, the phase detector 481, the phase statistics block 483 may be configured in the same manner as above-described with respect to FIG. 4. Accordingly, a further description thereof has been omitted for the sake of brevity.

In the example embodiment of FIG. 7, the phase information transmitter 730 may receive a statistical value with respect to the phase skew information extracted from the data bit DQ5 from the phase statistics block 483 and may transmit the received statistical value (e.g., the phase skew information PI) to the phase information receiver 611 (e.g., in real time).

In the example embodiment of FIG. 7, unlike the parallel interface system 400 illustrated in FIG. 4, the parallel interface system 700 may transmit phase skew information PI from the second semiconductor device 720 to the first semiconductor device 710 through an additional phase information transmission line Line9. If the phase skew information PI is transmitted through the separate phase information transmission line Line9, the phase skew information PI may be transmitted to the first semiconductor device 710 in real time without necessarily affecting the data. As a result, higher-bandwidth CDR may be achieved. The example embodiment of FIG. 7 has been illustrated and above-described with respect to an 8-bit parallel interface. However, it is understood that other example embodiments may be directed to a parallel interface having any number of bits, such as, for example, 16 bits, 32 bits, etc. Accordingly, the bits may be grouped by N bits.

Figure 8:
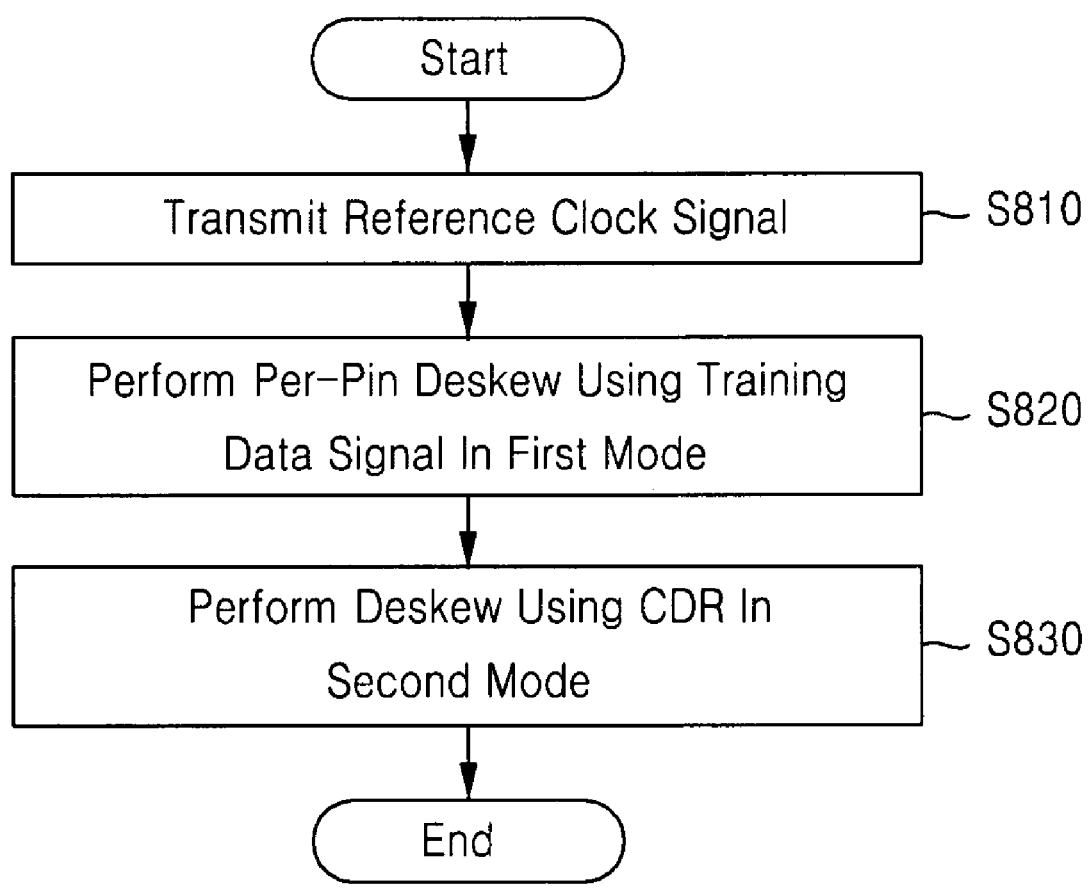
FIG. 8 is a flowchart of a process for reducing skew between an N-bit parallel data signal and a reference clock signal in a parallel interface system according to another example embodiment of the present invention.

FIG. 8 is a flowchart of a process for reducing skew between an N-bit parallel data signal and a reference clock signal in a parallel interface system according to another example embodiment of the present invention.

In the example embodiment of FIG. 8, a reference clock signal may be transmitted to a receiving semiconductor device (at S810). Per-pin deskew may be performed using a training data signal in a first mode (at S820). In the per-pin deskew using the training data signal, if the phase of a transmitting sampling clock signal of a transmitting semiconductor device is changed, the training data signal may be transmitted to the receiving semiconductor device (e.g., during the phase adjustment). The transmitted training data signal may be compared with training data signals received back from the receiving semiconductor device. Based on a result of the comparison, the phase of the transmitting sampling clock signal for each bit of N-bit parallel data may be controlled (e.g., individually controlled).

In the example embodiment of FIG. 8, deskew may be performed using CDR in a second mode (at S830). In the deskew using CDR, phase information may be extracted from a given data bit among N bits of parallel data received by the receiving semiconductor device and the extracted phase information may be transmitted to the transmitting semiconductor device. The phases of the transmitting sampling clock signal for each respective bits of parallel data may be collectively controlled based on the extracted phase information.

In the example embodiment of FIG. 8, the parallel interface system may be in the first mode if the parallel interface system is being powered up. Accordingly, the first mode may be referred to as an initial mode. If the parallel interface system performs per-pin deskew using training data and operates according to a result of the per-pin deskew, the parallel interface system may be referred to as being in the second mode.

Figure 9:
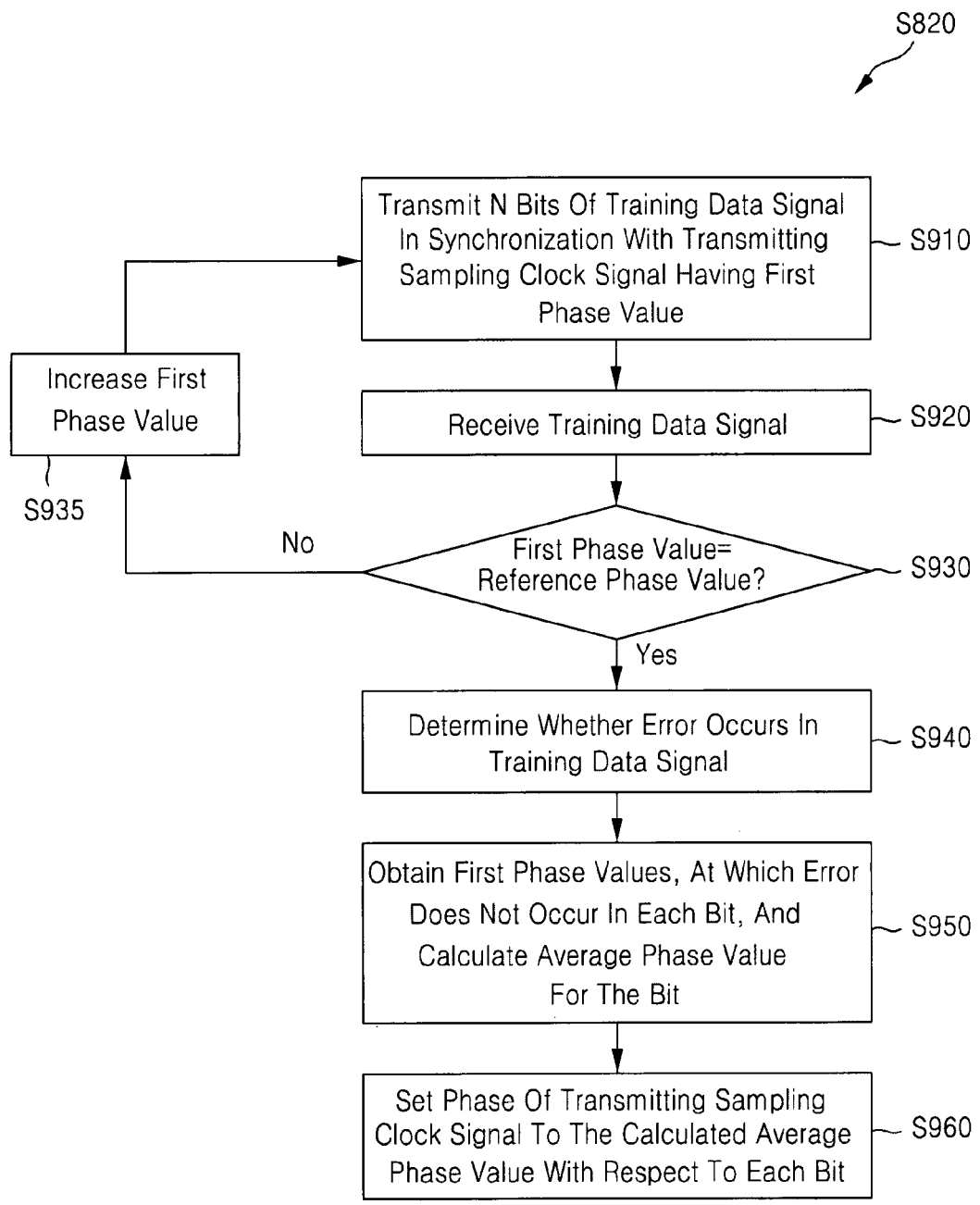
FIG. 9 a flowchart expanding upon the reference clock transmission process of FIG. 8 during the per-pin deskew process using the training data signal according to another example embodiment of the present invention.

FIG. 9 a flowchart expanding upon the reference clock transmission process (at S810) of FIG. 8 during the per-pin deskew process using the training data signal according to another example embodiment of the present invention. In the example embodiment of FIG. 9, the transmitting semiconductor device may transmit N bits of the training data signal to the receiving semiconductor device in synchronization with the transmitting sampling clock signal having a first phase value (at S910). The receiving semiconductor device may receive the training data signal in synchronization with a given receiving sampling clock signal. The given receiving sampling clock signal may be generated based on the reference clock signal transmitted from the transmitting semiconductor device in synchronization with the transmitting sampling clock signal. For example, the given receiving sampling clock signal may have a half-period phase difference with respect to the reference clock signal.

In the example embodiment of FIG. 9, a timing error (e.g., a phase skew) may occur between the reference clock signal received by the receiving semiconductor device and each bit of the received N-bit training data signal.

In the example embodiment of FIG. 9, the received training data signal may be stored in the receiving semiconductor device (at S920). The transmitting semiconductor device may determine whether the first phase value of the transmitting sampling clock signal is the same as a reference phase value (at S930). If the transmitting semiconductor device determines that the first phase value of the transmitting sampling clock signal is not the same as the reference phase value (e.g., a phase value of a single period of the training data signal), the first phase value may be increased (e.g., by a fixed value) (at S935) and the process may return to S910. For example, the transmitting semiconductor device may repeatedly increase the phase value of the transmitting sampling clock signal (e.g., by the fixed value) during a single period of the training data signal and may transmit the training data signal to the receiving semiconductor device in synchronization with the transmitting sampling clock signal having a changed phase.

Figure 2A:
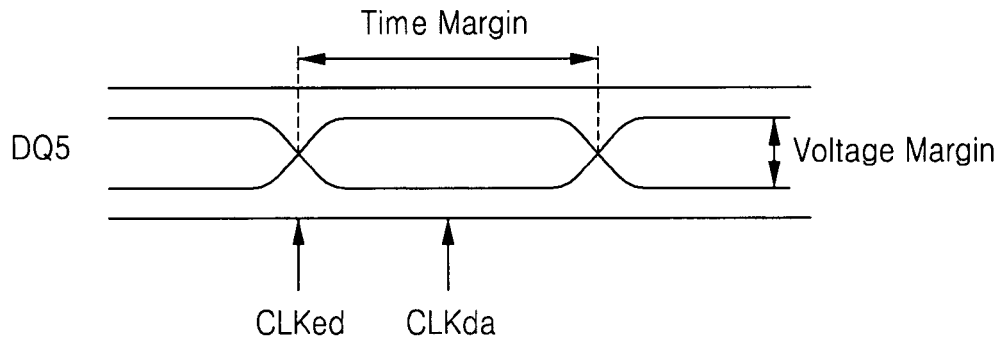
FIGS. 2A through 2C are conceptual diagrams illustrating the conventional per-pin deskew process using clock and data recovery (CDR).

In the example embodiment of FIG. 9, the transmitting semiconductor device may receive the training data signal stored in the receiving semiconductor device in synchronization with a given transmitter's receiving sampling clock signal. The given transmitter's receiving sampling clock signal may be positioned so as to provide a maximum time margin (e.g., as shown in FIG. 2A). A per-pin deskew operation on the transmitter's receiving sampling clock signal will be described in greater detail later.

In the example embodiment of FIG. 9, if the transmitting semiconductor device determines that the first phase value of the transmitting sampling clock signal is the same as the reference phase value, the process may determine whether an error is present in each bit of the N-bit training data signal with respect to different first phase values of the transmitting sampling clock signal (at S940). First phase values of the transmitting sampling clock signal, which may correspond to each bit of the N-bit training data signal and at which an error does not occur in a given bit, may be obtained and an average phase value may be calculated for the given bit (at S950). Average phase values may be obtained with respect to the N bits, respectively, of the training data signal. A phase of the transmitting sampling clock signal for each bit of data may be set to the average phase value obtained corresponding to the given bit (at S960). Accordingly, a skew between the reference clock signal and a given data bit, which may occur in the receiving semiconductor device, may be reduced by controlling the phase of the transmitting sampling clock signal in the transmitting semiconductor device.

In the example embodiment of FIG. 9, the per-pin deskew operation performed on the transmitter's receiving sampling clock signal using the training data signal as will now be described. The training data signal may be transmitted to the receiving semiconductor device in synchronization with a transmitter's transmitting sampling clock signal having a given lower frequency and the receiving semiconductor device may store the received training data signal. It may be assumed that the transmitted training data signal does not include an error.

In the example embodiment of FIG. 9, the transmitting semiconductor device may receive the training data signal stored in the receiving semiconductor device in response to the transmitter's receiving sampling clock signal having different phase values. Next, it is determined whether an error occurs in each bit of the training data signal with respect to the different phase values of the transmitter's receiving sampling clock signal. Phase values of the transmitter's receiving sampling clock signal, which correspond to each bit of the N-bit training data signal and at which an error does not occur in a given bit, may be obtained and an average phase value is calculated for the given bit. A phase of the transmitter's receiving sampling clock signal for receiving each bit of data may be set to the average phase value obtained corresponding to the given bit. As described above, the per-pin deskew process using the training data need not include a skew compensation circuit in the receiving semiconductor device, whereby power consumption of the receiving semiconductor device may thereby be reduced.

Figure 10:
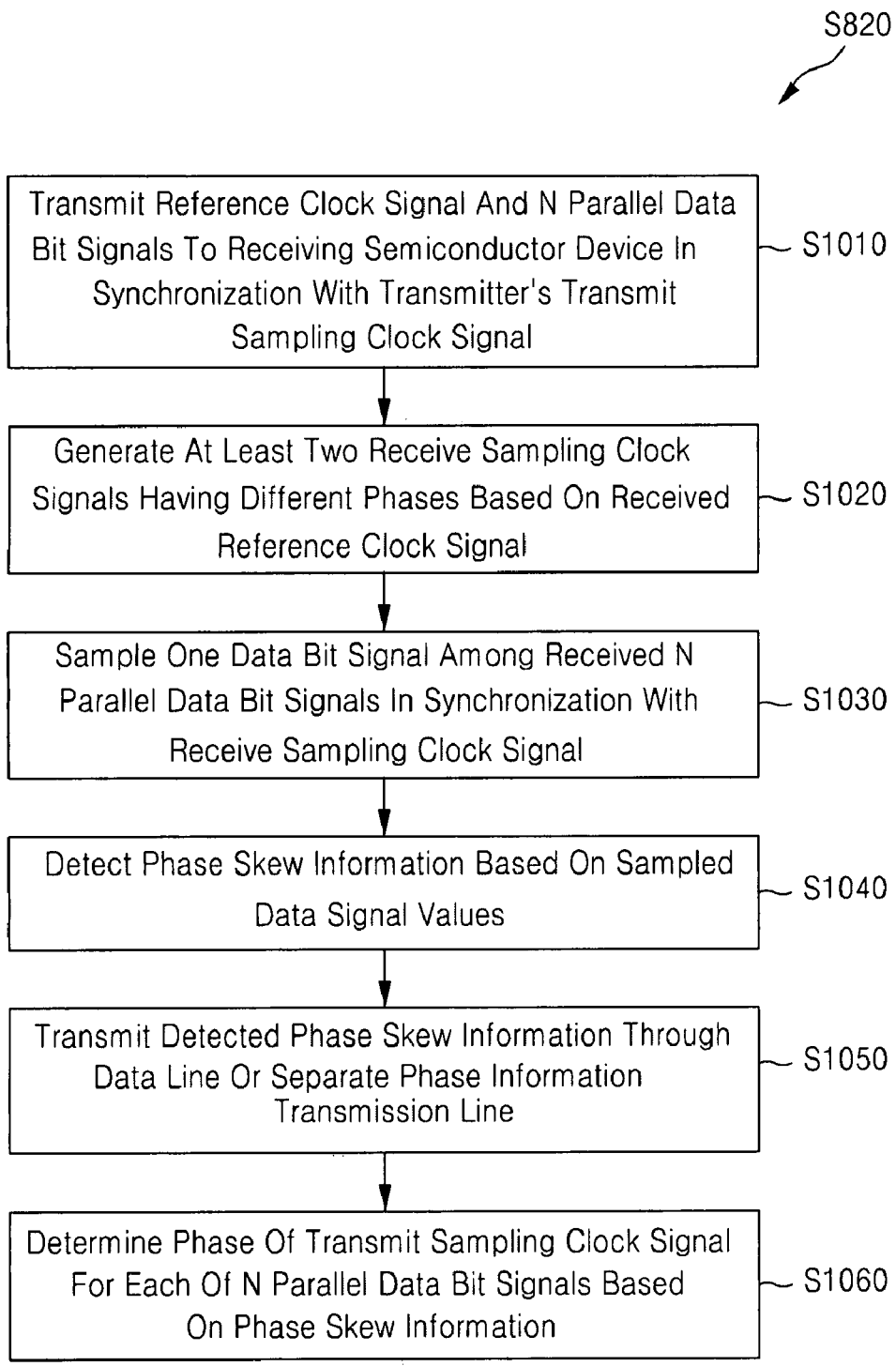
FIG. 10 is a flowchart illustrating a per-pin deskew process using CDR during the process of FIG. 8 according to another example embodiment of the present invention.

FIG. 10 is a flowchart illustrating a per-pin deskew process using CDR at S830 of the process of FIG. 8 according to another example embodiment of the present invention.

In the example embodiment of FIG. 10, the transmitting semiconductor device may transmit the reference clock signal and N parallel data bit signals to the receiving semiconductor device in synchronization with the transmitted sampling clock signal (at S1010). The receiving semiconductor device may generate at least two receiver's receiving sampling clock signals having different phases based on the reference clock signal (at S1020). For example, an edge sampling clock signal, which may be in-phase with the reference clock signal and a data sampling clock signal (e.g., which may have a half-period phase difference with the reference clock signal may be generated.

In the example embodiment of FIG. 10, at least one signal among the N parallel data bit signals may be sampled in synchronization with the receiver's receiving sampling clock signals (at S1030). Phase skew information related to the receiver's receiving sampling clock signal may be detected based on sampled data signal values (at S1040). For example, a signal of a single data bit DQ5 among the 8 parallel data bits DQ1 through DQ8 may be sampled using the edge sampling clock signal and the data sampling clock signal in the receiving semiconductor device. In an example, because a delay difference between the bit DQ1 and the bit DQ8 may be higher (e.g., highest) in the receiving semiconductor device, the bit DQ5 may be assumed to have a medium delay value. For this reason, the bit DQ5 may be selected from the parallel data bits DQ1 through DQ8 and phase skew information of the bit DQ5 may be detected. The detected phase skew information may be transmitted to the transmitting semiconductor device to control the phase of the transmitting sampling clock signal used to transmit the bit DQ5 in the transmitting semiconductor device.

Figure 2B:
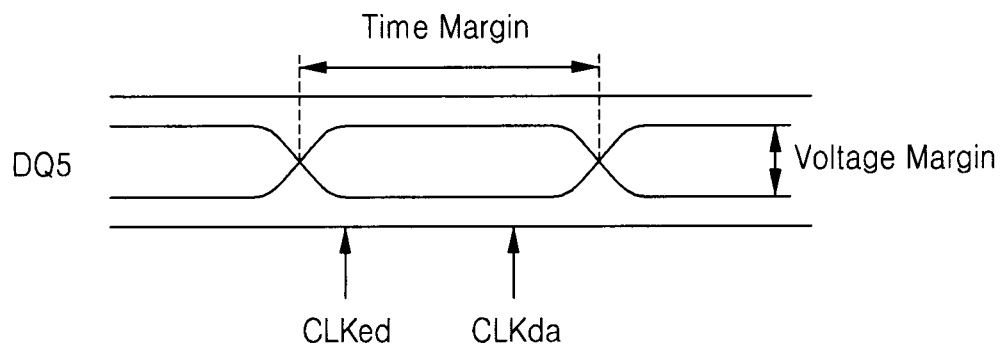

In the example embodiment of FIG. 10, if the phase skew information of the bit DQ5 detected by the receiving semiconductor device is similar to the skew illustrated in conventional FIG. 2B, a time delay of the data bit signal DQ5 may be less than a time delay of the reference clock signal. In an alternative example, if the phase skew information is similar to the skew illustrated in FIG. 2C, the time delay of the data bit signal DQ5 may be greater than that of the reference clock signal.

In the example embodiment of FIG. 10, the receiving semiconductor device may transmit the detected phase skew information to the transmitting semiconductor device through a data line or a separate phase information transmission line (at S1050). In an example, an interval and/or an instant of time at which the detected phase skew information is transmitted to the transmitting semiconductor device through the data line may be adjusted by the transmitting semiconductor device adaptively, for example, based on an environment of the parallel interface system. If the detected phase skew information is transmitted through the separate phase information transmission line, the detected phase skew information may be transmitted to the transmitting semiconductor device (e.g., in real time) without affecting data, and therefore, higher-bandwidth CDR may be achieved.

In the example embodiment of FIG. 10, a phase value of the transmitting sampling clock signal of the transmitting semiconductor device may be determined for each signal of N parallel data bit signals based on the phase skew information (at S1060). If the phase skew information of the bit DQ5 detected by the receiving semiconductor device is similar to the skew illustrated in conventional FIG. 2B, the transmitting semiconductor device may transmit the data bit signal DQ5 later than the reference clock signal in order to shift the data sampling clock signal CLKda to a position approximating a maximum time margin (e.g., as illustrated in FIG. 2A). Accordingly, the transmitting sampling clock signal used to transmit the data bit signal DQ5 may be controlled so as to have a "later" or delayed phase.

Figure 2C:
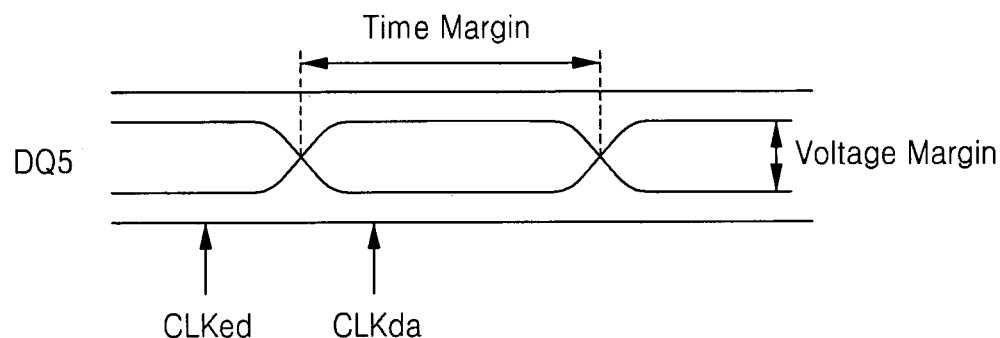
Figure 3:
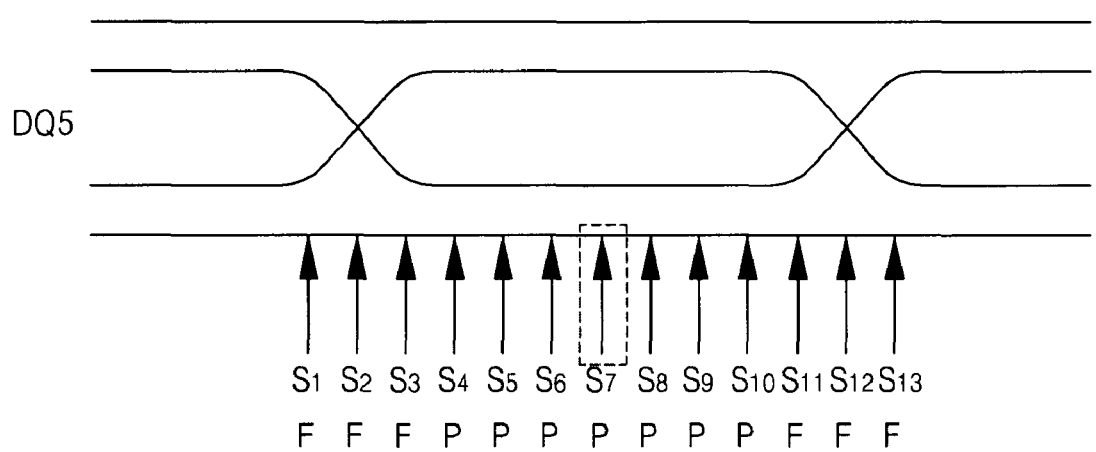
FIG. 3 is a conceptual diagram illustrating a conventional per-pin deskew process using training data.

In the example embodiment of FIG. 10, in an alternative example, if the phase skew information of the bit DQ5 is similar to the skew illustrated in conventional FIG. 2C, the transmitting semiconductor device may control the transmitting sampling clock signal used to transmit the data bit signal DQ5 so as to have an earlier phase in order to shift the data sampling clock signal CLKda to the position approximating the maximum time margin (e.g., as illustrated in FIG. 2A).

While above-described with respect to a hardware implementation, it is understood that other example embodiments of the present invention may be embodied as computer readable codes stored on a computer readable recording medium. The computer readable recording medium may be any data storage device that may store data which can be thereafter read by a computer system. Examples of the computer readable recording medium include read-only memory (ROM), random-access memory (RAM), CD-ROMs, magnetic tapes, optical data storage devices, etc. The computer readable recording medium may also be distributed over network coupled computer systems so that the computer readable code may be stored and executed in a distributed fashion (e.g., over the Internet). Also, functional programs, codes, and code segments for accomplishing the present invention may be easily constructed by programmers skilled in the art to which example embodiments of the present invention are directed.

In another example embodiment of the present invention, both static skew and dynamic skew may be reduced without prohibitively increasing either an occupied chip or circuit area and/or power consumption in a receiver. In addition, if phase skew information for reducing dynamic skew is transmitted through a transmission line separated from a data transmission line, the phase skew information may be transmitted to a transmitter in "real time" without affecting data transfers or logic operations. As a result, higher-bandwidth CDR may be accomplished because dynamic skew reduction may be implemented without significantly decreasing performance.

Example embodiments of the present invention being thus described, it will be obvious that the same may be varied in many ways. For example, while above-described example embodiments are directed generally to an 8-bit parallel interface system, it is understood that other example embodiments of the present invention may be directed to a parallel interface system including any number of bits.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor device included within a parallel interface system, comprising:
   a reference clock transmitting block generating a reference clock signal;
   a plurality of first transceiver blocks, each of the plurality of first transceiver blocks transmitting at least one parallel data bit signal based on one of a plurality of phase-controlled transmitting sampling clock signals; and
   a per-pin deskew block controlling a phase of a transmitting sampling clock signal to generate phase-controlled sampling clock signals for the respective plurality of first transceiver blocks,
   the per-pin deskew block controlling the phase of each phase-controlled transmitting sampling clock signal based on a phase skew between a given training data bit signal, among a plurality of training data bit signals, corresponding to a given first transceiver block and the reference clock signal in a first operation mode, and based on phase skew information relating to a phase skew between a given parallel data bit signal of the at least one parallel data bit signal and the reference clock signal in a second operation mode, wherein
   the per-pin deskew block,
      enables one of the plurality of training data bit signals to be transmitted to a receiving semiconductor device in synchronization with a corresponding phase controlled transmitting sampling clock signal,
      receives the training data bit signals back from the receiving semiconductor device in synchronization with a given receiving sampling clock signal, and
      outputs a plurality of control signals for respectively controlling the phases of the phase-controlled transmitting sampling clock signals respectively corresponding to the plurality of training data bit signals based on a comparison between the transmitted training data bit signals and the received training data bit signals.

2. The semiconductor device of claim 1, wherein the phase skew information is transmitted from a receiving semiconductor device to one of the plurality of first transceiver blocks via a data line.

3. The semiconductor device of claim 1, wherein each of the plurality of first transceiver blocks includes:
   a delay locked loop block controlling the phase of a given phase-controlled transmitting sampling clock signal based on one of a given control signal and the phase skew information;
   a driver outputting data in synchronization with the given phase-controlled transmitting sampling clock signal; and a clock and data recovery (CDR) reception block receiving one of data and the phase skew information.

4. The semiconductor device of claim 3, further comprising:
a plurality of selectors, each of the plurality of selectors selecting one of the given control signal and the phase skew information received by the corresponding clock and data recovery reception block in response to a mode control signal and outputting the selection to the delay locked loop block.

5. The semiconductor device of claim 1, further comprising:
at least one phase information receiver receiving the phase skew information from a receiving semiconductor device through at least one phase information transmission line.

6. The semiconductor device of claim 5, wherein each of the plurality of first transceiver blocks includes:
a delay locked loop block controlling the phase of a given phase-controlled transmitting sampling clock signal based on one of a given control signal and the phase skew information;
a driver outputting data in synchronization with the given phase-controlled transmitting sampling clock signal; and
a clock and data recovery reception block receiving data.

7. The semiconductor device of claim 6, further comprising:
a plurality of selectors, each of the plurality of selectors selecting one of the given control signal and the phase skew information received by the phase information receiver in response to a mode control signal and outputting the selection to the delay locked loop block.

8. A parallel interface system, comprising;
a first semiconductor device configured as the semiconductor device of claim 1, the phase skew information being received at the first semiconductor device from a second semiconductor device;
a plurality of connections between the first and second semiconductor devices;
the second semiconductor device including a reference clock receiving block receiving the reference clock signal and outputting at least two first receiving sampling clock signals having different phases based on the received reference clock signal, a plurality of second transceiver blocks transferring the plurality of parallel data bit signals to/from the plurality of first transceiver blocks, respectively, via one or more of the plurality of connections; and
a phase detector for detecting the phase skew information.

9. The parallel interface system of claim 8, wherein the second semiconductor device further comprises:
a phase statistics block transmitting, to the first semiconductor device, phase information calculated based on the phase skew information detected by the phase detector during a given period, the phase of the phase-controlled transmitting sampling clock signals being controlled based at least in part on the calculated phase information.

10. The parallel interface system of claim 9, wherein the second semiconductor device further comprises:
a selector transmitting the calculated phase information to one of the plurality of second transceiver blocks in response to a control command received from the first semiconductor device, at least one of the plurality of second transceiver blocks transmitting the calculated phase information to a corresponding first transceiver block among the plurality of first transceiver blocks.

11. The parallel interface system of claim 9, wherein the second semiconductor device includes a phase information transmitter for transmitting the calculated phase information and the first semiconductor device includes a phase information receiver for receiving the calculated phase information transmitted by the phase information transmitter.

12. A method of for reducing skew between a reference clock signal and each of a plurality of parallel data bit signals in a parallel interface system including a plurality of transceiver blocks, comprising:
first mode adjusting a phase of a sampling clock signal to generate a phase-controlled sampling clock signal based on a phase skew between a training data bit signal, among a plurality of training data bit signals, corresponding to a given transceiver block and a reference clock signal in a first operation mode; and
second mode adjusting the phase of the sampling clock signal to generate the phase-controlled sampling clock signal based on phase skew information relating to a phase skew between a given data bit signal and the reference clock signal in a second operation mode, wherein
the sampling clock signal is a transmitting sampling clock signal,
the first mode adjusting step includes,
transmitting a plurality of training data bit signals to a receiving semiconductor device in synchronization with the transmitting sampling clock signal, and
receiving the plurality of training data bit signals back from the receiving semiconductor device in synchronization with a given receiving sampling clock signal, and
the first mode adjusting step further adjusts the phase of the transmitting sampling clock signal for each of the plurality of transceiver blocks based on a comparison between the transmitted plurality of training data bit signals and the received plurality of training data bit signals.

13. The method of claim 12, wherein,
the transmitting sampling clock signal has a given frequency,
the receiving sampling clock signal has different phase values respectively for each of the plurality of training data bit signals, and
wherein the first mode adjusting step further adjusts the phases of the receiving sampling clock signal based on a comparison between the transmitted plurality of training data bit signals and the received plurality of training data bit signals.

14. The method of claim 12, wherein the second mode adjusting step includes:
receiving the phase skew information from a receiving semiconductor device via one of the plurality of transceiver blocks.

15. The method of claim 12, wherein the second mode adjusting step includes:
receiving the phase skew information from a receiving semiconductor device via a phase information receiver.

16. The method of claim 12, wherein the transmitting sampling clock signal is a first of two transmitting sampling clock signals, each phase-controlled first transmitting sampling clock signal corresponding to one of the plurality of parallel data bit signals.

17. The method of claim 16, wherein the second mode adjusting step includes:

transmitting the reference clock signal and the plurality of parallel data bit signals, which are transmitted in synchronization with the first transmitting sampling clock signal, from a first semiconductor device to a second semiconductor device; and detecting, at the second semiconductor device, the phase skew information; and transmitting the phase skew information from the second semiconductor device to the first semiconductor device.

18. The method of claim 17, wherein the detecting step includes:

generating a plurality of receiving sampling clock signals, each of the receiving sampling clock signals having different phases based on the reference clock signal; and detecting the phase skew information based on a result of sampling at least one data bit signal among the plurality of parallel data bit signals in synchronization with the plurality of receiving sampling clock signals.

19. The method of claim 18, wherein the detecting step further includes:

sampling the at least one data bit signal based on the receiving sampling clock signals, a first of the plurality of receiving sampling clock signals being in phase with the reference clock signal and a second of the receiving sampling clock signals having a half-period phase difference with the reference clock signal.

20. The method of claim 18, wherein the transmitting the phase skew information step includes:

transmitting the phase skew information to the first semiconductor device through a data line corresponding to the sampled at least one data bit signal in response to a control command received from the first semiconductor device.

21. The method of claim 18, wherein the transmitting the phase skew information step includes:

transmitting the phase skew information to the first semiconductor device through a phase information transmission line.

* * * * *